US008444368B2

(12) United States Patent
Irie

(10) Patent No.: US 8,444,368 B2
(45) Date of Patent: May 21, 2013

(54) SUBSTRATE TRANSPORT APPARATUS AND CONTROL METHOD FOR SUBSTRATE TRANSPORT APPARATUS

(75) Inventor: Kouji Irie, Shinagawa-ku (JP)

(73) Assignee: Hirata Corporation, Shinagawa-Ku, Tokyo (JP)

( * ) Notice: Subject to any disclaimer, the term of this patent is extended or adjusted under 35 U.S.C. 154(b) by 306 days.

(21) Appl. No.: 12/793,894

(22) Filed: Jun. 4, 2010

(65) Prior Publication Data

US 2010/0239397 A1 Sep. 23, 2010

Related U.S. Application Data

(63) Continuation of application No. PCT/JP2007/073510, filed on Dec. 5, 2007.

(51) Int. Cl.
*B25J 9/00* (2006.01)

(52) U.S. Cl.
USPC ........................ 414/744.3; 901/17; 74/490.01

(58) Field of Classification Search
USPC ........ 414/744.1, 744.5, 744.2, 744.3; 901/15, 901/17; 74/490.01; 700/213, 245
See application file for complete search history.

(56) References Cited

U.S. PATENT DOCUMENTS

| | | | | |
|---|---|---|---|---|
| 4,606,691 | A * | 8/1986 | Zalucky | 414/680 |
| 7,572,742 | B2 | 8/2009 | Hiroki | |
| 7,751,939 | B2 | 7/2010 | Cho et al. | |
| 2006/0216137 | A1 | 9/2006 | Sakata et al. | |
| 2007/0275486 | A1 | 11/2007 | Hiroki | |

FOREIGN PATENT DOCUMENTS

| | | | |
|---|---|---|---|
| JP | 07-099225 | A | 4/1995 |
| JP | 11-010577 | A | 1/1999 |
| JP | 11-188669 | A | 7/1999 |
| JP | 3172900 | B1 | 3/2001 |
| JP | 2003-136442 | A | 5/2003 |
| JP | 2006-198760 | A | 8/2006 |
| KR | 10-2006-0126600 | A | 12/2006 |
| WO | WO 2005/004230 | A1 | 1/2005 |
| WO | WO 2005/098934 | A1 | 10/2005 |

OTHER PUBLICATIONS

International Search Report (PCT/ISA/210) of PCT/JP2007/073510 dated Jan. 8, 2008.
Non-English version of the Written Opinion (PCT/ISA/237) of PCT/JP2007/073510 dated Jan. 8, 2008.
Office Action from Japanese Patent Office issued in corresponding Japanese Patent Application No. 2009-544533 dated Jan. 20, 2012.
Office Action dated Mar. 30, 2012, issued by the Korean Patent Office in corresponding Korean Patent Application No. 10-2010-7014462. (6 pages).

* cited by examiner

*Primary Examiner* — Scott Lowe
(74) *Attorney, Agent, or Firm* — Buchanan Ingersoll & Rooney PC

(57) ABSTRACT

This invention provides a substrate transport apparatus (100) which transports a substrate (W) placed on a hand portion (10) to a processing apparatus or a predetermined storage unit. The substrate transport apparatus (100) includes a moving means (20) for supporting the proximal side (**10*b*) of the hand portion (10) serving as one end of the hand portion (10), and reciprocally moving the hand portion (10) in the direction of its extension, a tilt detection means (30) for detecting the tilt of a distal end (10*a*) of the hand portion (10) with respect to the horizontal direction, which accompanies flexure of the hand portion (10) upon placing the substrate (W) on the hand portion (10), and a tilt correction means (40) for generating a pitching motion of the hand portion (10) as a whole so as to cancel the tilt of the distal end (10*a*) of the hand portion (10**).

9 Claims, 15 Drawing Sheets

F I G. 3
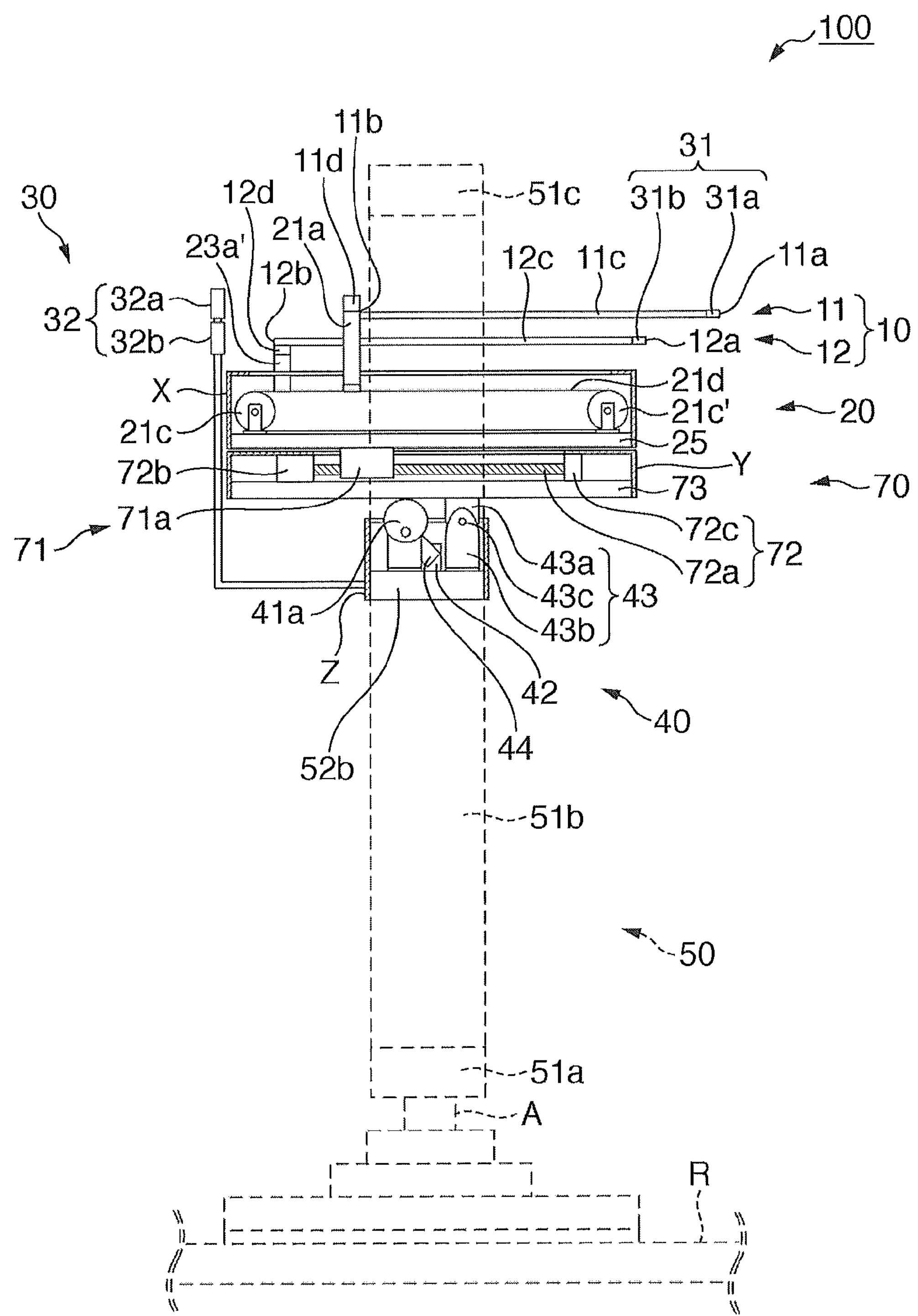

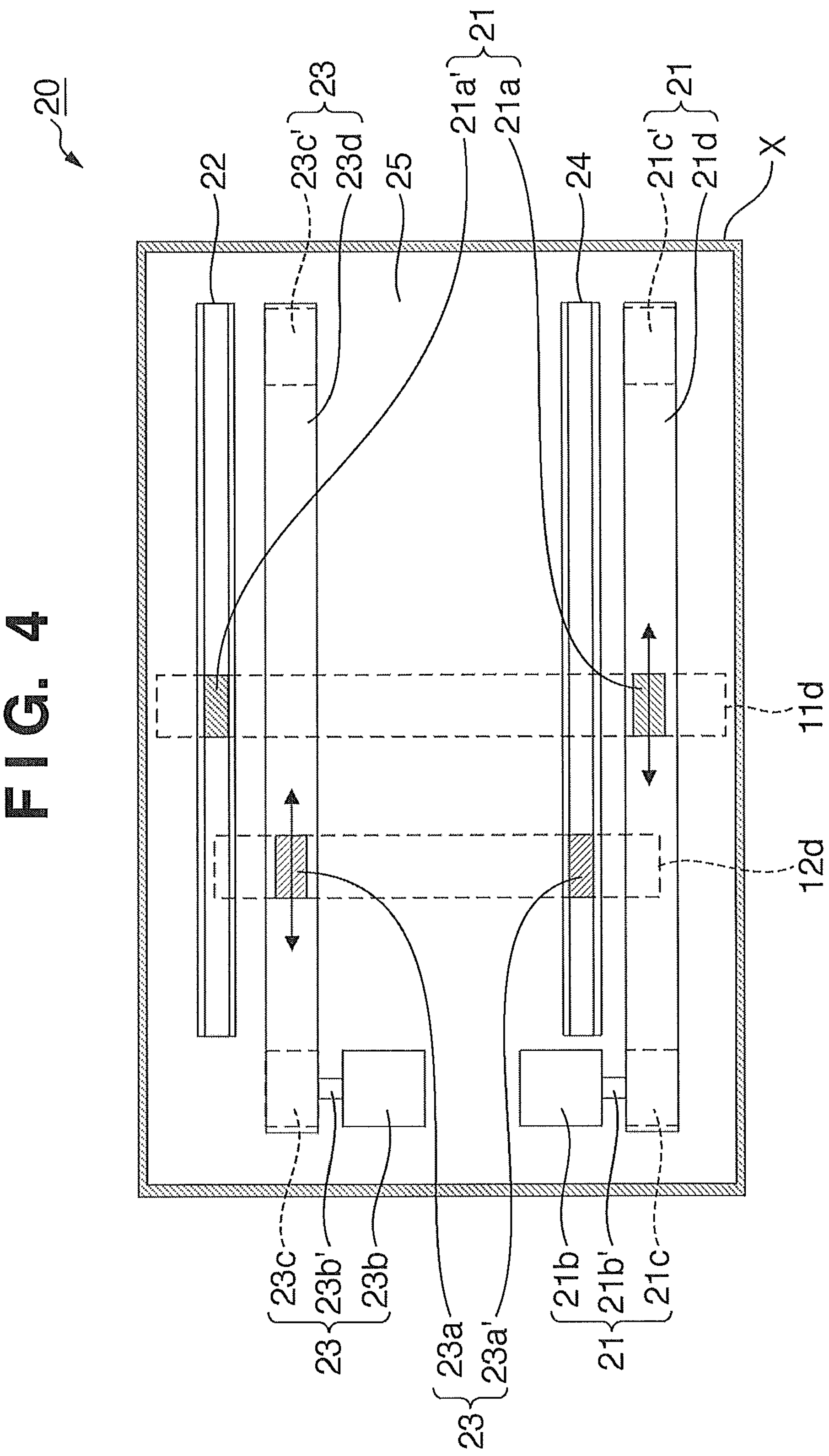
F I G. 4
20
22
23c'
23d
23
25
21a'
21a
21
24
21c'
21d
21
X
11d
12d
23c
23b'
23b
23
23a
23a'
23
21b
21b'
21
21c

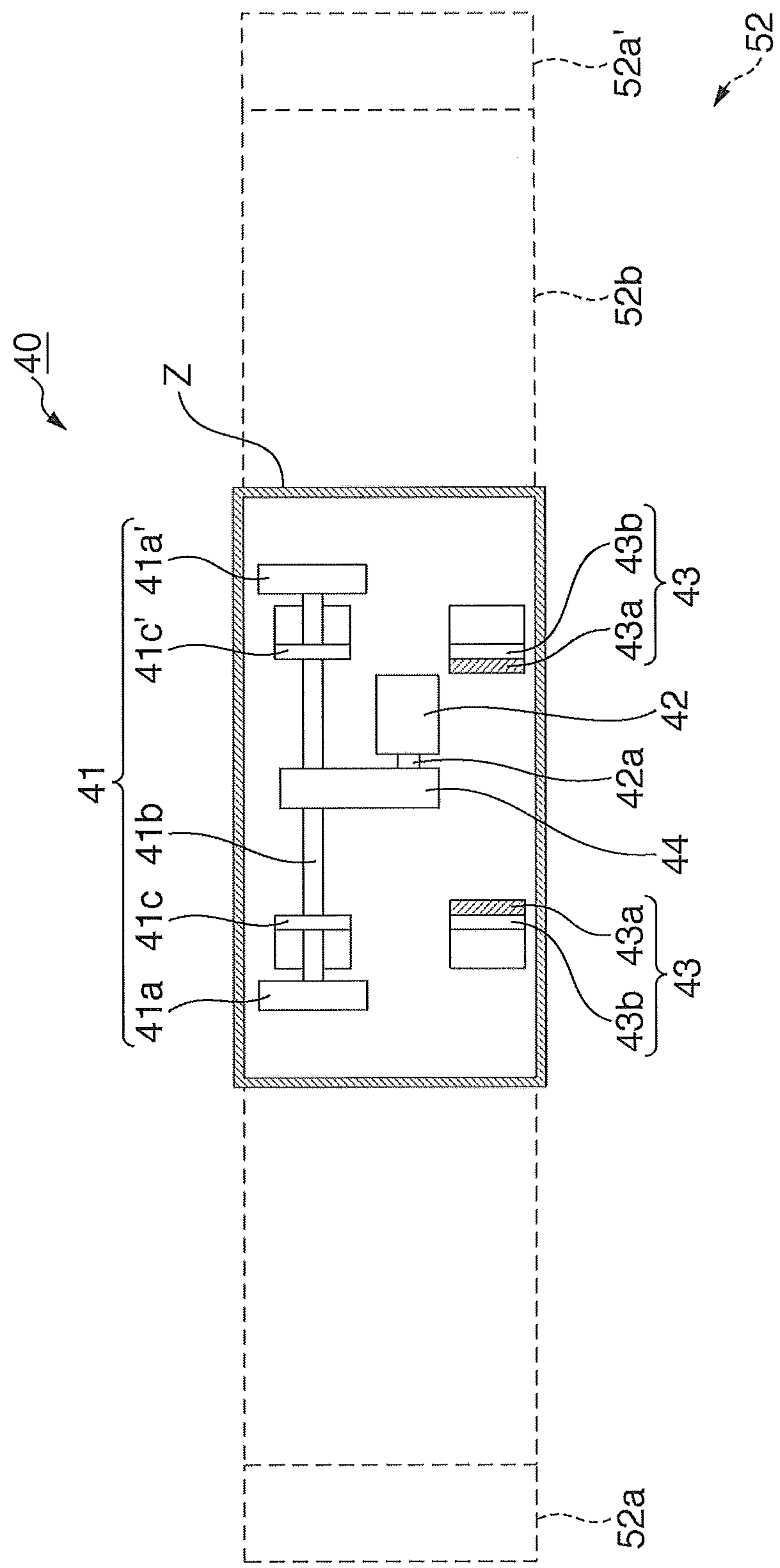
F I G. 5
40
Z
52
52a'
52b
52a
41
41a'
41c'
41b
41c
41a
42
42a
44
43
43a
43b

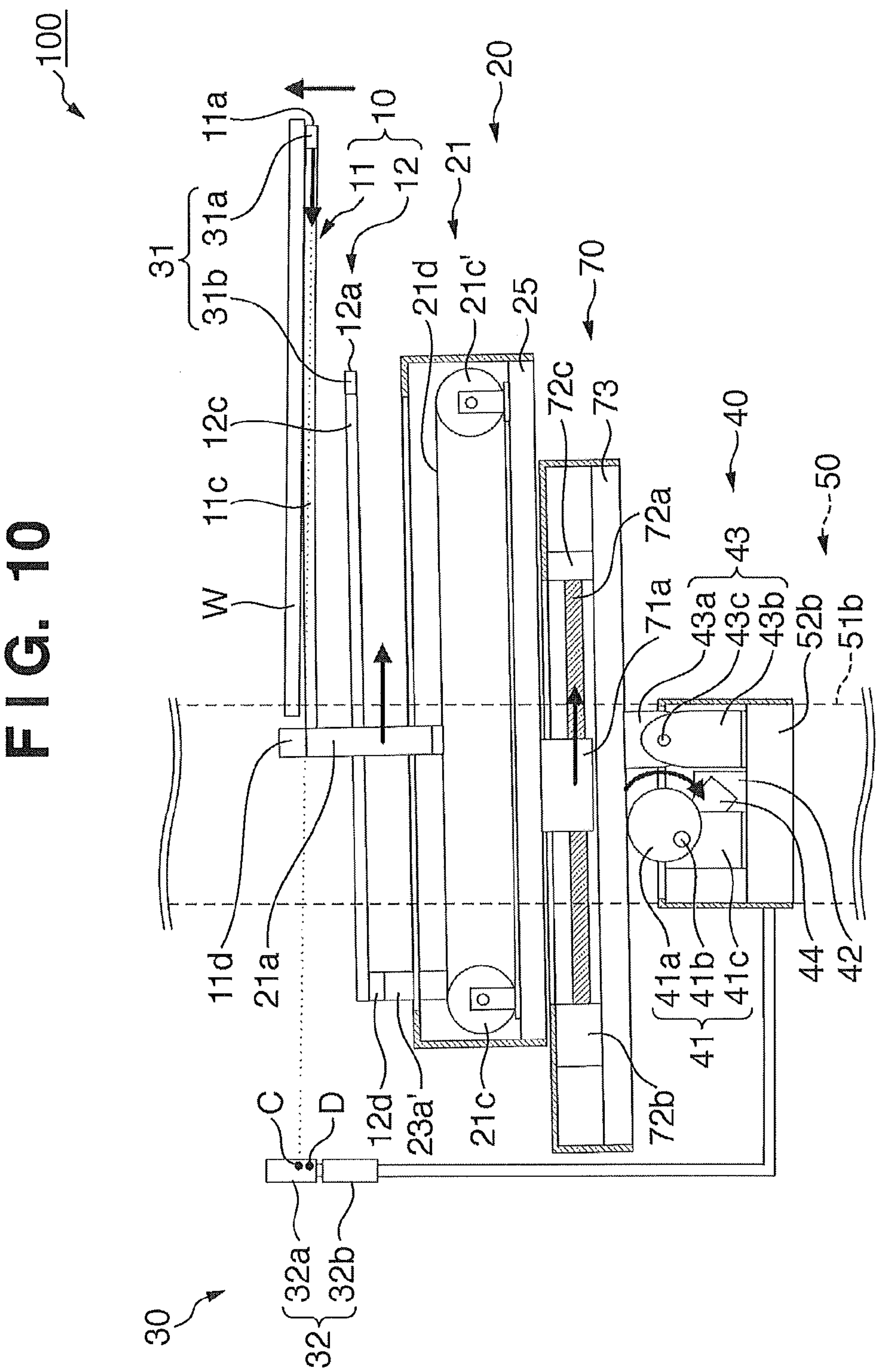
F I G. 10
100
20
21
10
11
12
11a
31
31a
31b
12a
21d
21c'
25
70
72c
73
40
50
12c
11c
72a
43
43a
43c
43b
52b
51b
W
71a
11d
21a
41a
41b
41c
41
44
42
12d
23a'
21c
72b
C
D
32a
32b
32
30

100
W
11a
31a
11
12
10
20
11c
12a
31b
21c'
25
11d
21a
12c
70
73
40
72c
43
50
71a
43a
43c
43b
52b
51b
12d
23a'
21d
21c
72a
41a
41b
41c
44
42
41
72b
30
32
32a
32b
C, D

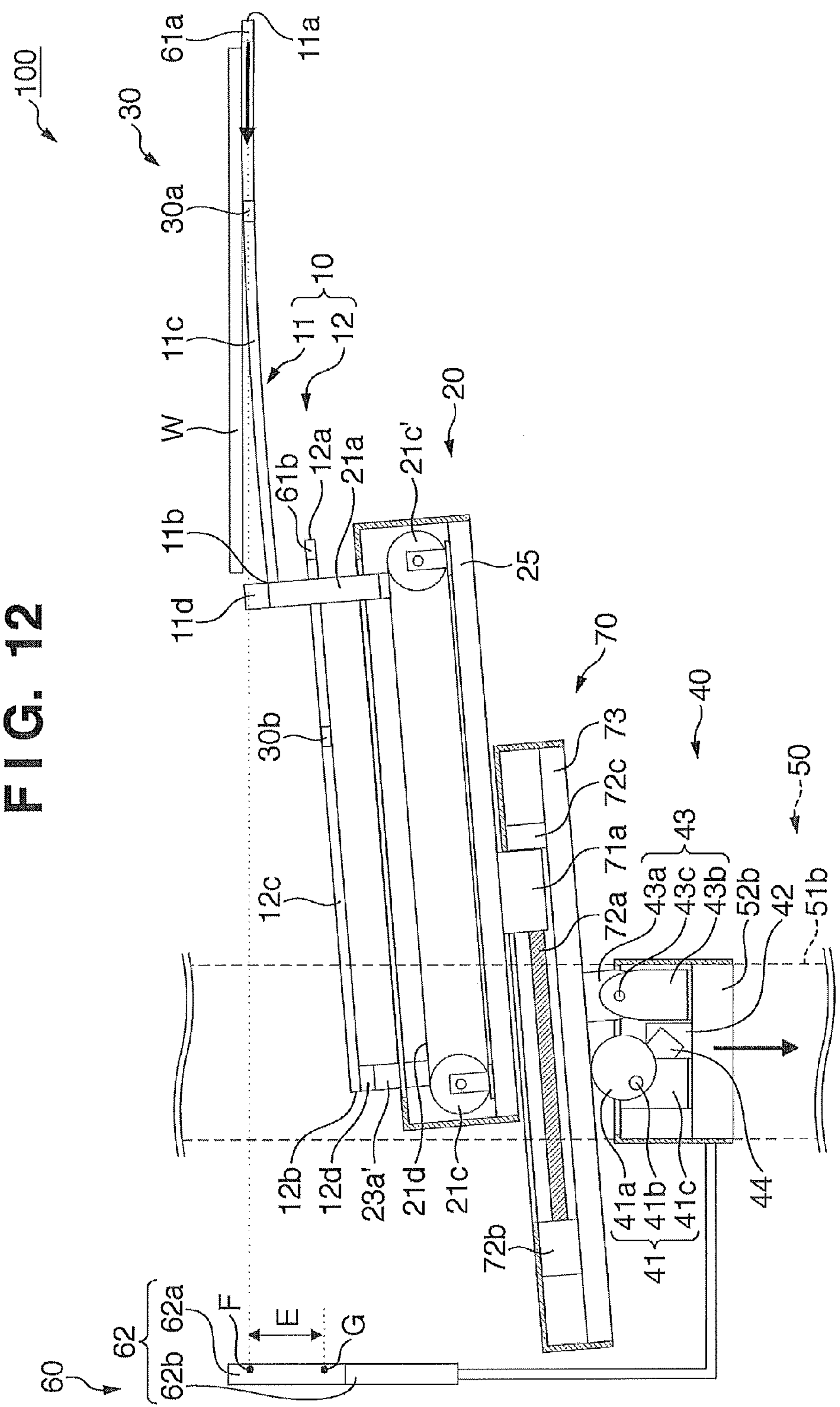
F I G. 12
100
30
61a
11a
30a
10
11c
11
12
W
20
12a
61b
21a
21c'
11b
11d
25
70
30b
73
40
72c
50
71a
43
12c
72a
43a
43c
43b
52b
42
51b
44
12b
12d
23a'
21d
21c
41a
41b
41c
41
72b
62
62a
62b
F
E
G
60

SUBSTRATE TRANSPORT APPARATUS AND CONTROL METHOD FOR SUBSTRATE TRANSPORT APPARATUS

TECHNICAL FIELD

The present invention relates to a substrate transport apparatus which transports a substrate such as a liquid crystal panel, and a control method for the substrate transport apparatus.

BACKGROUND ART

A robot which transports a substrate such as a liquid crystal panel generally has a cantilevered hand with a fork on which a substrate is placed. In recent years, as the substrate size increases, the fork inevitably elongates. The fork itself is made of lightweight rigid carbon so as to reduce its flexure. In contrast, flexure occurs at the hand front end due to its own weight and the substrate weight to a larger degree in a direction away from the robot main body, that is, the center of gravity in the hand. Therefore, in the process of transporting a substrate to a processing apparatus for the next process or to a cassette, the substrate may cause a fault upon interfering with the processing apparatus or the cassette or may be damaged. To prevent this, various techniques for correcting flexure of the hand have been proposed.

For example, Japanese Patent Laid-Open No. 7-99225 discloses a technique for rotating an eccentric cam using an air cylinder to pivot a hand about a supporting portion in placing a substrate on the hand, thereby correcting the tilt angle of the hand in a direction opposite to that of flexure which has occurred upon placing the substrate on the hand.

Also, International Publication No. 2005/004230 discloses a technique for rotating a screw to tilt a tilting table on which a hand is fixed in placing a substrate on the hand, thereby correcting the tilt angle of the hand.

Note that the amount of flexure of the hand changes depending on, for example, the weight of the transported substrate. In this respect, the technique disclosed in Japanese Patent Laid-Open No. 7-99225 assumes that the amount of flexure of the hand is constant. Therefore, this technique is inapplicable when substrates with different weights are transported. On the other hand, International Publication No. 2005/004230 discloses a method of storing in advance information concerning the amount of flexure of the hand due to the weight of each substrate, and correcting the tilt angle of the hand based on the type of transported substrate and the stored information. Unfortunately, it is cumbersome to store in advance information concerning the amount of flexure of the hand due to the weight of each substrate. Furthermore, it is impossible to correct the tilt angle of the hand in transporting a substrate whose information is not stored.

SUMMARY OF INVENTION

It is an object of the present invention to more easily horizontally transport a substrate placed on a hand while measuring flexure of the hand, which has actually occurred, and correcting it in real time.

According to the present invention, there is provided a substrate transport apparatus which transports a substrate placed on a hand portion to one of a processing apparatus and a predetermined storage unit, comprising: moving means for supporting a proximal side of the hand portion serving as one end of the hand portion, and reciprocally moving the hand portion in a direction of an extension thereof; tilt detection means for detecting a tilt of a distal end of the hand portion with respect to a horizontal direction in real time, which accompanies flexure of the hand portion upon reciprocally moving the hand portion; tilt correction means for generating a pitching motion of the hand portion as a whole in the direction in which the tilt of the distal end of the hand portion is canceled; and controlling means for controlling the pitching motion of said tilt collection means to move the hand portion in the condition in which the tilt of the hand portion is canceled.

Also, according to the present invention, there is provided a control method for a substrate transport apparatus which comprises a hand portion on which a substrate is placed, and moving means for supporting a proximal side of the hand portion serving as one end of the hand portion, and reciprocally moving the hand portion in a direction of an extension thereof, and which transports the substrate to one of a processing apparatus and a predetermined storage unit, comprising: a tilt detection step of detecting a tilt of a distal end of the hand portion with respect to a horizontal direction in real time, which accompanies flexure of the hand portion occurring when the moving means reciprocally moves the hand portion; a tilt correction step of generating a pitching motion of the hand portion as a whole in the direction in which the tilt of the distal end of the hand portion is canceled; and a controlling step of controlling the pitching motion so as to generate the pitching motion in the direction canceling the tilt of the hand portion, and move/extend the hand portion to a horizontal direction.

BRIEF DESCRIPTION OF DRAWINGS

FIG. 3 is a side view of the substrate transport apparatus 100 shown in FIG. 1;

FIG. 4 is a partial sectional view of a moving portion 20;

FIG. 5 is a top view of a tilt correction unit 40;

FIG. 10 is an enlarged side view showing the state of the substrate transport apparatus 100 in operation;

FIG. 12 is an enlarged side view of a substrate transport apparatus 200 according to the second embodiment;

BEST MODE FOR CARRYING OUT THE INVENTION

First Embodiment

[Entire Arrangement]

Figure 1:
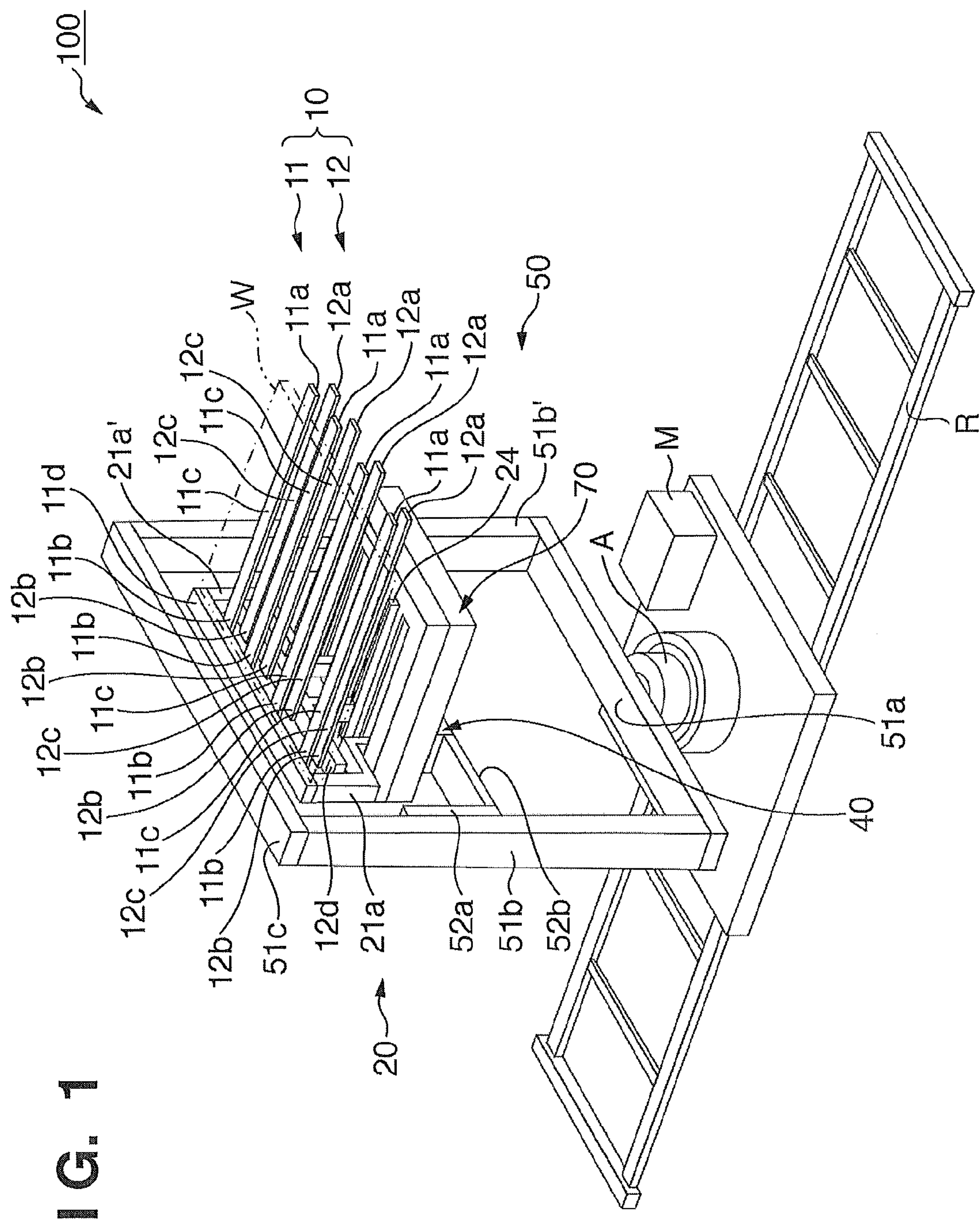
FIG. 1 is a perspective view of the whole of a substrate transport apparatus 100 according to one embodiment of the present invention.
Figure 2:
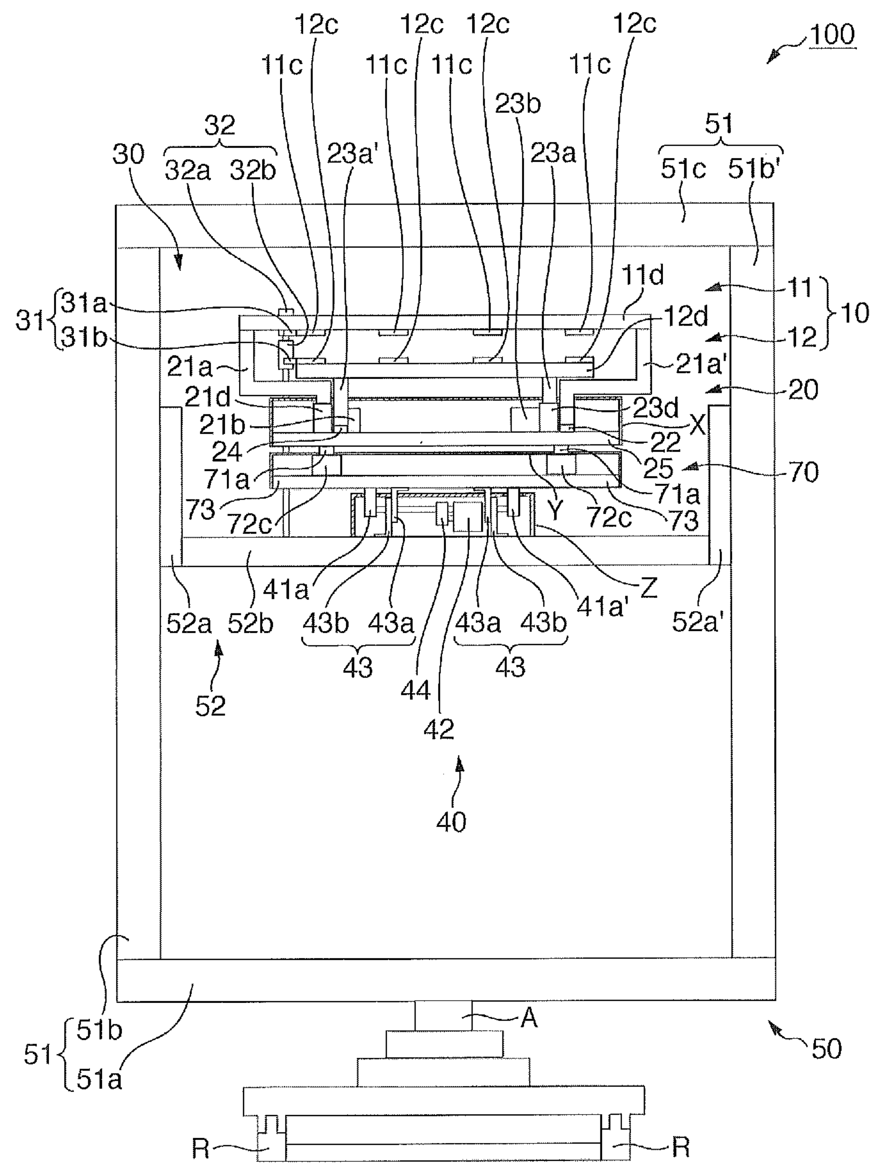
FIG. 2 is a front view of the substrate transport apparatus 100 shown in FIG. 1.

FIG. 1 is a perspective view of the whole of a substrate transport apparatus 100 according to one embodiment of the present invention. FIG. 2 is a front view of the substrate transport apparatus 100 shown in FIG. 1. FIG. 3 is a side view of the substrate transport apparatus 100 shown in FIG. 1. FIG. 4 is a partial sectional view of a moving portion 20.

The substrate transport apparatus 100 transports a substrate (for example, a glass substrate) placed on a hand portion 10 to a processing apparatus or a predetermined storage unit. Examples of the processing apparatus are apparatuses which perform cleaning, drying, and other types of processing of a substrate. An example of the storage unit is a storage cassette which can store a plurality of substrates in it. The substrate transport apparatus 100 can be moved along rails R by driving a driving unit M such as a motor, and can be pivoted integrally about a rotating shaft A as a center.

The substrate transport apparatus 100 includes the hand portion 10 including two hand portions: an upper hand portion and a lower hand portion (the upper hand portion will be referred to as an "upper hand portion 11" hereinafter, and the lower hand portion will be referred to as a "lower hand portion 12" hereinafter), the moving portion 20, a tilt detection unit 30, and a tilt correction unit 40. The moving portion 20 supports proximal sides 11*b* and 12*b* each of which serves as one end of a corresponding one of the upper and lower hand portions 11 and 12, and reciprocally moves the upper and lower hand portions 11 and 12 in the directions of their extensions. The tilt detection unit 30 detects the tilt of a distal end 11*a* or 12*a* of the upper or lower hand portion 11 or 12 with respect to the horizontal direction, which accompanies flexure of the upper or lower hand portion 11 or 12 upon placing a substrate W on it when one of the upper and lower hand portions 11 and 12 is moved forward. The tilt correction unit 40 generates a pitching motion of the hand portion 10 as a whole so as to cancel the tilts of the distal ends 11*a* and 12*a* of the upper and lower hand portions 11 and 12.

The upper and lower hand portions 11 and 12 are spaced apart from each other by a predetermined distance to be independently operable. Also, the upper and lower hand portions 11 and 12 include pluralities of fork members 11*c* and 12*c* which are equidistantly arranged in parallel, and bundling members 11*d* and 12*d* which support the proximal sides (rear end sides) 11*b* and 12*b* of the fork members 11*c* and 12*c*. The fork members 11*c* and 12*c* can be made of, for example, a carbon fiber with strong material characteristics.

The moving portion 20 includes an upper belt driving mechanism 21, upper guide portion 22, lower belt driving mechanism 23, lower guide portion 24, and upper base 25, as shown in FIG. 4. The upper belt driving mechanism 21 is located on one side of the upper hand portion 11 in the widthwise direction. The upper guide portion 22 is located on the other side of the upper hand portion 11 in the widthwise direction. The lower belt driving mechanism 23 is located on the other side of the lower hand portion 12 in the widthwise direction. The lower guide portion 24 is located on one side of the lower hand portion 12 in the widthwise direction. The upper base 25 mounts, on its upper surface, the upper belt driving mechanism 21, upper guide portion 22, lower belt driving mechanism 23, and lower guide portion 24.

The upper belt driving mechanism 21 is configured such that a motor 21*b* has an output shaft 21*b*' connected to a pulley 21*c* and a belt 21*d* is driven by rotating the pulley 21*c*. One frame member 21*a* which supports the bundling member 11*d* of the upper hand portion 11 is connected to the belt 21*d*, and the other frame member 21*a*' is connected to the upper guide portion 22, thereby reciprocally moving the upper hand portion 11.

The lower belt driving mechanism 23 is configured such that a motor 23*b* has an output shaft 23*b*' connected to a pulley 23*c* and a belt 23*d* is driven by rotating the pulley 23*c*. One frame member 23*a* which supports the bundling member 12*d* of the lower hand portion 12 is connected to the belt 23*d*, and the other frame member 23*a*' is connected to the lower guide portion 24, thereby reciprocally moving the lower hand portion 12.

In this embodiment, the substrate transport apparatus 100 also includes a second moving portion 70 which reciprocally moves the upper base 25, which is mounted on the moving portion 20, in the direction of an extension of the hand portion 10. The second moving portion 70 includes a slider 71, sliding mechanism 72, and lower base 73, as shown in FIG. 3. The slider 71 is fixed on the lower surface of the upper base 25. The sliding mechanism 72 is fixed on the upper surface of the lower base 73 (to be described later) and reciprocally moves the slider 71 in the direction of an extension of the hand portion 10. The lower base 73 is set at a position below the upper base 25 to be spaced apart from it by a predetermined distance.

In this embodiment, the slider 71 includes a ball screw nut 71*a* which is fixed on the lower surface of the upper base 25 and threadably engages with a ball screw shaft 72*a* (to be described later). The sliding mechanism 72 includes the ball screw shaft 72*a*, a ball screw motor 72*b*, and a bearing 72*c*. The ball screw shaft 72*a* is fixed on the lower base 73 to be freely rotatable. The ball screw motor 72*b* rotationally drives the ball screw shaft 72*a*. The bearing 72*c* is attached to the end of the ball screw shaft 72*a* and rotatably supports it.

With this arrangement, the hand portion 10 can extend/contract in two steps and thus can extend farther away. This makes it possible to transport a large substrate. When a large substrate is transported, flexure of the hand portion 10 upon moving it forward is so large that the application of the present invention is of prime importance. Note that the entire moving portion 20 is covered with a dust-proof cover X fixed on the upper base 25 through a bolt, and the entire second moving portion 70 is covered with a dust-proof cover Y fixed on the lower base 73 through a bolt.

To allow the frame members 21*a* and 21*a*' which support the upper hand portion 11 and the frame members 23*a* and 23*a*' which support the lower hand portion 12 to protrude from the upper surface of the dust-proof cover X and move, the dust-proof cover X has slits in the movable ranges of said frame members. Similarly, to allow the ball screw nut 71*a* to protrude from the upper surface of the dust-proof cover Y and move, the dust-proof cover Y has a slit in its movable range.

The tilt detection unit 30 includes irradiation units 31*a* and 31*b* and shift amount detection units 32*a* and 32*b*, as shown in FIGS. 2 and 3. The irradiation units 31*a* and 31*b* are disposed near the distal ends 11*a* and 12*a* of the fork members 11*c* and 12*c*, and emit light beams parallel to the directions of extensions of the fork members 11*c* and 12*c*. The shift amount detection units 32*a* and 32*b* receive the light beams and detect the amounts of shift between the light-receiving positions of these light beams and predetermined light-receiving reference positions. In this embodiment, each of the shift amount detection units 32*a* and 32*b* includes a light-receiving device which receives a light beam, and an arithmetic device which calculates the amount of shift between the light-receiving position and the light-receiving reference position. The calculation results obtained by the calculators are sent to a control unit 300 (to be described later) as signals.

In this embodiment, each of the shift amount detection units 32*a* and 32*b* includes not only a light-receiving device but also an arithmetic device, and sends the calculated shift amount to the control unit 300 (to be described later). However, each of the shift amount detection units 32*a* and 32*b* may include only a light-receiving device and send information regarding the light-receiving position to the control unit 300, and the control unit 300 may calculate the shift amount.

Note that the hand portion 10 tilts to a larger degree in a direction closer to the distal ends 11*a* and 12*a* of the fork members 11*c* and 12*c*. Hence, the maximum tilt amount of the hand portion 10 can be reliably detected by disposing the irradiation units 31*a* and 31*b* at the distal ends 11*a* and 12*a* of the fork members 11*c* and 12*c*, where the hand portion 10 tilts to a maximum degree.

The irradiation units 31*a* and 31*b* can use, for example, infrared rays or a laser beam. The predetermined reference positions can be set, for example, to the levels of the upper surfaces of the fork members 11*c* and 12*c* on the proximal sides 11*b* and 12*b*. This is because the proximal sides 11*b* and 12*b* have the same levels as the distal ends 11*a* and 12*a* of the fork members 11*c* and 12*c*, respectively, when the upper and lower hand portions 11 and 12 are not bent.

FIG. 5 is a top view of the tilt correction unit 40. The tilt correction unit 40 (to be also referred to as the "actuator 40" hereinafter) is set at a position below the lower base 73, and generates a pitching motion of the lower base 73 as a whole. The actuator 40 includes an eccentric cam mechanism 41, an eccentric cam motor 42, and hinge portions 43. The eccentric cam mechanism 41 includes two eccentric cams 41*a* and 41*a*' connected to each other via a rotating shaft 41*b*. The eccentric cam motor 42 is fixed on the upper surface of a supporting portion 52*b* and has an output shaft 42*a*. The hinge portions 43 serve as fulcrums in tilting the lower base 73.

The rotating shaft 41*b* of the eccentric cams 41*a* and 41*a*' is supported by bearings 41*c* and 41*c*' fixed on the supporting portion 52*b*. The output shaft 42*a* of the eccentric cam motor 42 is connected to a decelerator 44, which is connected to the rotating shaft 41*b* of the eccentric cams 41*a* and 41*a*'. With this arrangement, the output from the eccentric cam motor 42 can be transmitted to the rotating shaft 41*b* of the eccentric cams 41*a* and 41*a*' to rotate the eccentric cams 41*a* and 41*a*'.

The hinge portion 43 includes plates 43*a* and 43*b* and a rotating shaft 43*c*. The plate 43*a* is fixed on the lower surface of the lower base 73. The plate 43*b* is fixed on the upper surface of the supporting portion 52*b* (to be described later). The rotating shaft 43*c* connects the plates 43*a* and 43*b* such that the plates are freely pivotable. The hinge portion 43 pivotably supports the lower base 73 with respect to the supporting portion 52*b* about the rotating shaft 43*c* as a center.

Hence, the hinge portion 43 pivotably connects the lower base 73 and the supporting portion 52*b* to each other, and the eccentric cams 41*a* and 41*a*' support the lower base 73 such that the lower base is vertically movable. This makes it possible to generate a pitching motion of the lower base 73 about the rotating shaft 43*c* (see FIG. 3) of the hinge portion 43 as a center by driving the eccentric cam motor 42.

The tilt correction unit 40 has its side surfaces and upper surface covered with a dust-proof cover Z fixed on the supporting portion 52*b* (to be described later). However, the dust-proof cover Z has slits with sizes, that do not interfere with the movable ranges of the eccentric cams 41*a* and 41*a*' and plate 43*b*, at the positions corresponding to these movable ranges on the upper surface of the tilt correction unit 40. Also, the tilt correction unit 40 is not limited to the above-mentioned driving structure, and may generate a pitching motion of the lower base 73 by moving forward/backward the portion where the supporting portion 52*b* supports the lower base 73.

A lift mechanism 50 includes a frame 51 and a carriage 52 which engages with the frame 51 to be vertically slidable. The frame 51 includes a base member 51*a*, masts 51*b* and 51*b*', and a connecting member 51*c*. The base member 51*a* is connected to the above-mentioned rotating shaft A to be freely pivotable and extends horizontally. The masts 51*b* and 51*b*' extend vertically to the base member 51*a*. The connecting member 51*c* connects the masts 51*b* and 51*b*' to each other at their upper ends.

The carriage 52 includes lift portions 52*a* and 52*a*' and a supporting portion 52*b*. The lift portions 52*a* and 52*a*' engage with the inner surface of the frame 51 and extend vertically. The supporting portion 52*b* connects the lift portions 52*a* and 52*a*' to each other.

Figure 6:
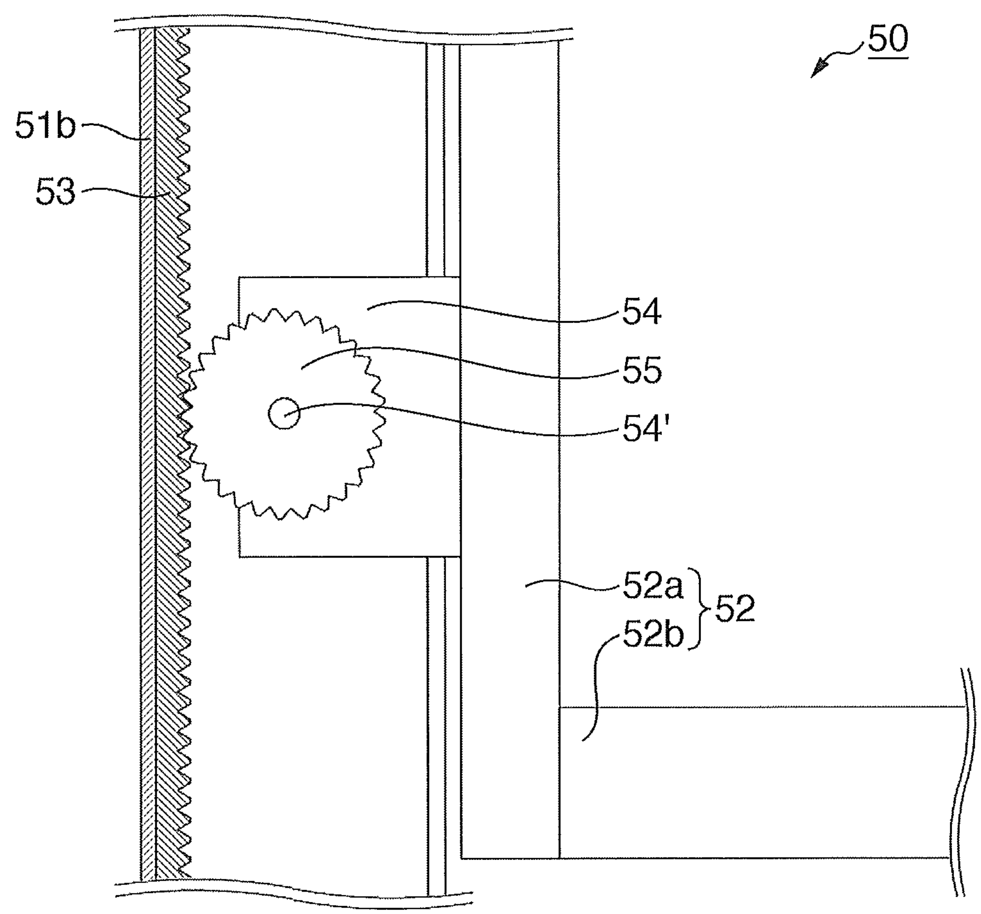
FIG. 6 is a partial sectional view of a lift mechanism 50.

FIG. 6 is a partial sectional view of the lift mechanism 50. The lift mechanism 50 also includes racks 53, driving units 54 such as motors, and pinion gears 55. The racks 53 are fixed on the inner walls of the masts 51*b* and 51*b*'. The driving units 54 are fixed on the lift portions 52*a* and 52*a*'. The pinion gears 55 are connected to output shafts 54' of the driving units 54 and mesh with the racks 53. Hence, the pinion gears 55 can be rotated by driving the driving units 54 to lift/lower the upper and lower hand portions 11 and 12, moving portion 20, tilt detection unit 30, and tilt correction unit 40.

Figure 7:
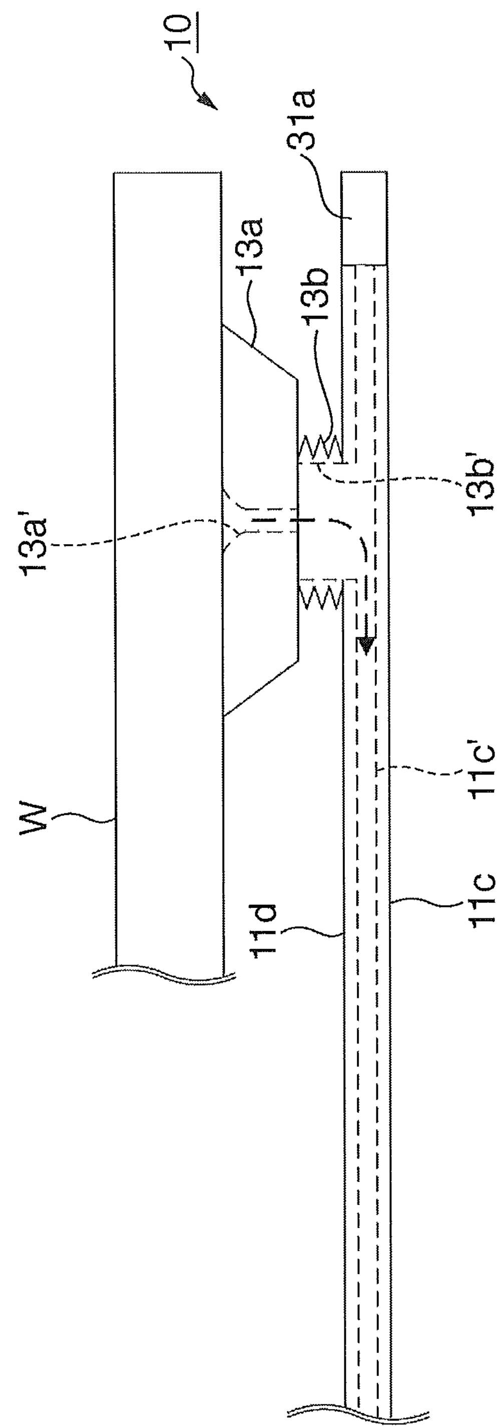
FIG. 7 is an enlarged side view of a hand portion 10.

FIG. 7 is an enlarged side view of the hand portion 10. Although not shown in FIGS. 1 to 3, a plurality of substrate chucking members 13 are mounted on each of the upper surfaces 11*d* and 12*d* of the fork members 11*c* and 12*c* of the upper and lower hand portions 11 and 12. Only the upper hand portion 11 will be described herein, but the lower hand portion 12 has the same arrangement as the upper hand portion 11.

The substrate chucking member 13 includes a dished main body 13*a* and a bellows portion 13*b* serving as a buffer. A suction hole 13*a*' runs through the main body 13*a* at its center. The suction hole 13*a*' communicates with a suction passage 11*c*', formed in the fork member 11*c*, via an internal space 13*b*' of the bellows portion 13*b*.

The suction passage 11*c*' is connected to an exhaust unit (not shown) including, for example, a vacuum pump. When a substrate W is placed on the substrate chucking member 13, the ambient gas in the suction hole 13*a*' is sucked via the suction passage 11*c*' and internal space 13*b*' by the exhaust unit to form a vacuum state in the substrate chucking member 13. With this operation, the substrate W is chucked by (brought into tight contact with) the fork members 11*c* and 12*c*. This makes it possible to prevent the substrate W from slipping off the hand portion 10.

Although the substrate chucking member 13 is evacuated to prevent the substrate W from slipping off the hand portion 10 in this embodiment, it need not always be evacuated as long as the same effect can be obtained only by a frictional force. Alternatively, the substrate W may be prevented from slipping off the hand portion 10 using, for example, pins to support the edge of the substrate W.

Figure 8:
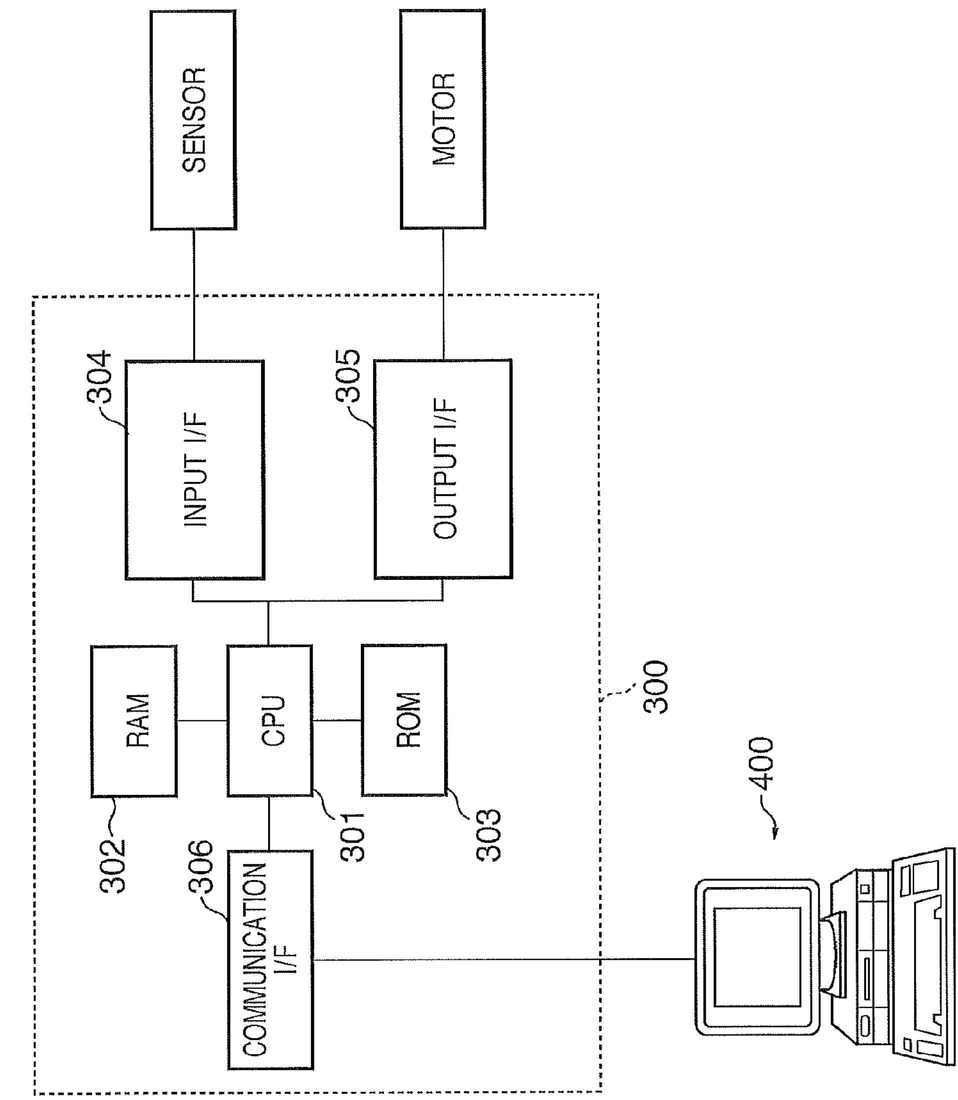
FIG. 8 is a block diagram showing the configuration of a control unit 300 of the substrate transport apparatus 100.

FIG. 8 is a block diagram showing the configuration of the control unit 300 of the substrate transport apparatus 100. The control unit 300 includes a CPU 301, RAM 302, and ROM 303. The CPU 301 controls the overall operation of the substrate transport apparatus 100. The RAM 302 provides a work area to the CPU 301 and stores, for example, variable data. The ROM 303 stores fixed data such as a control program and control data. The RAM 302 and ROM 303 can be substituted by other storage means.

An input interface (I/F) 304 serves as an interface between the CPU 301 and various types of sensors (for example, the shift amount detection units 32*a* and 32*b*). The CPU 301 acquires the detection results obtained by the various types of sensors via the input I/F 304. An output interface (I/F) 305 serves as an interface between the CPU 301 and various types of motors (for example, the motors 21*b* and 23*b*, eccentric cam motor 42, and ball screw motor 72*b*). The CPU 301 controls the various types of motors via the output I/F 305.

A communication interface (I/F) 306 serves as an interface between the CPU 301 and a host computer 400 that controls the overall operation of the substrate transport apparatus 100. The CPU 301 controls the substrate transport apparatus 100 in accordance with a command from the host computer 400.

[Operation Explanation]

Figure 9:
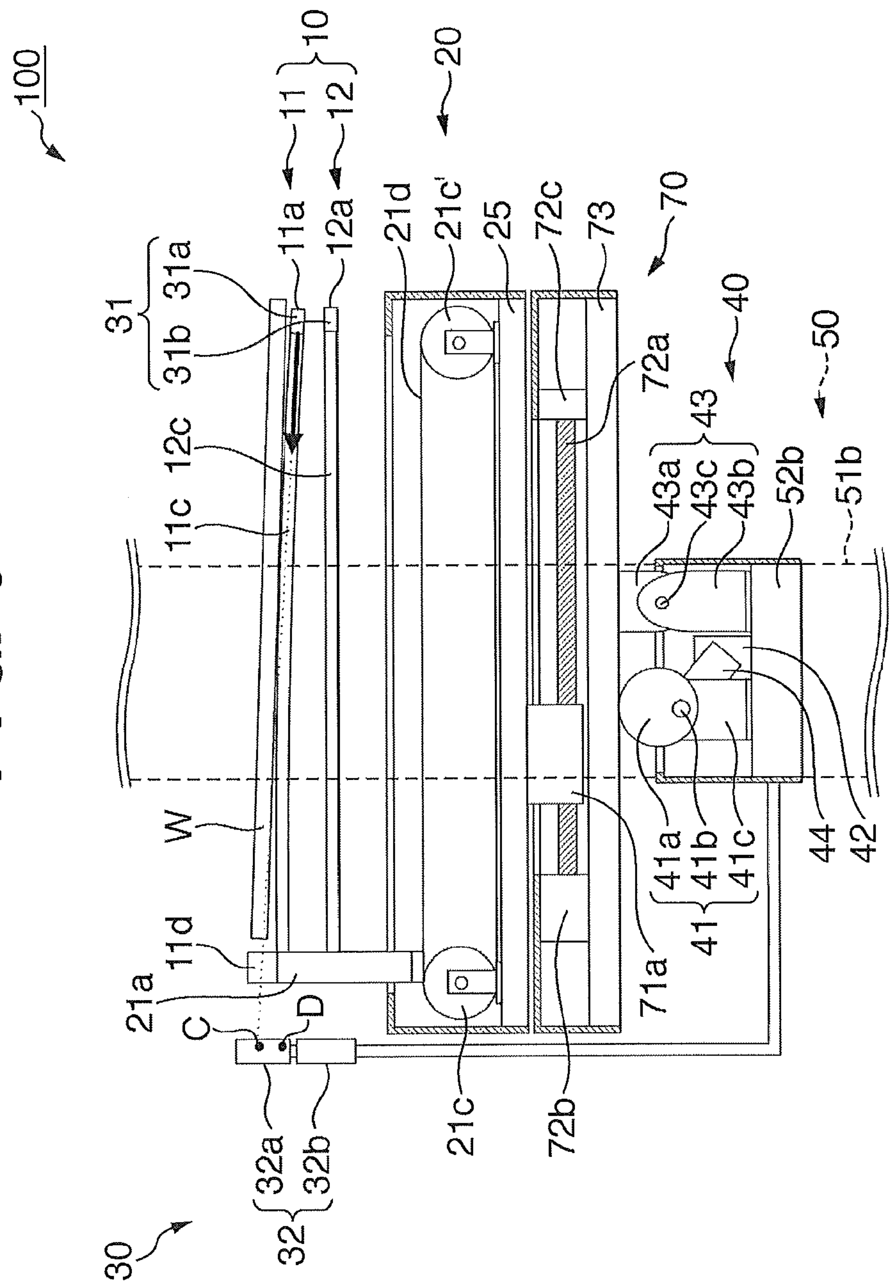
FIG. 9 is an enlarged side view showing the state of the substrate transport apparatus 100 before the start of operation.
Figure 11:
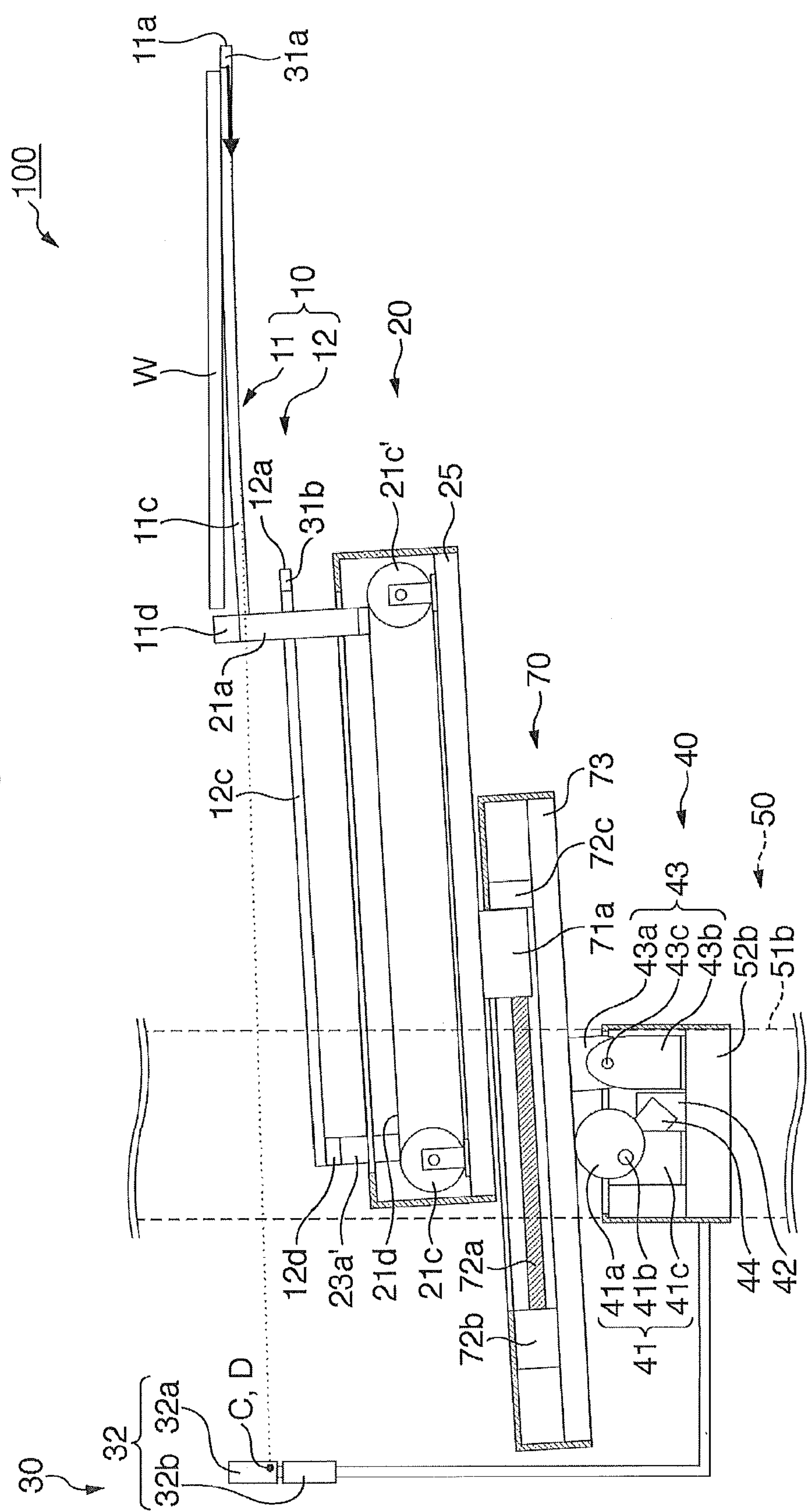
FIG. 11 is an enlarged side view showing the state of the substrate transport apparatus 100 upon completion of operation.

FIG. 9 is an enlarged side view showing the state of the substrate transport apparatus 100 before the start of operation. FIG. 10 is an enlarged side view showing the state of the substrate transport apparatus 100 in operation. FIG. 11 is an enlarged side view showing the state of the substrate transport apparatus 100 upon completion of operation. Although the following description assumes a situation in which the moving portion 20 moves the upper hand portion 11, the same operation applies to the lower hand portion 12.

First, as shown in FIG. 9, in this embodiment, the tilt detection unit 30 constantly detects the tilt of the distal end 11*a* of the upper hand portion 11 on which the substrate W is placed. That is, the shift amount detection unit 32*a* of the tilt detection unit 30 constantly detects the amount of shift between a light-receiving position C of a light beam emitted by the irradiation unit 31*a*, and a predetermined light-receiving reference position D. The predetermined light-receiving reference position mentioned herein means the position (reference position D) where the shift amount detection unit 32*a* receives light while flexure does not occur in the hand portion 10, that is, before the substrate W is placed on the hand portion 10.

In this embodiment, because the fork members 11*c* and 12*c* are high-strength members made of, for example, a carbon fiber, flexure of the hand portion 10 due to its own weight is small enough to be ignored. However, if flexure of the hand portion 10 is too large to be ignored because of the use of members made of other materials, correction need only be performed in advance so that the light-receiving position C coincides with the light-receiving reference position D while the substrate W is not placed on the hand portion 10 (zero point correction).

Next, as shown in FIG. 10, the ball screw motor 72*b* of the second moving portion 70 is driven to slide the ball screw nut 71*a* in the direction of an extension of the hand portion 10. With this movement, the upper base 25 moves forward. Concurrently with this operation, the upper belt driving mechanism 21 of the moving portion 20 is driven to drive the belt 21*d*, thereby moving the frame member 21*a* forward. With this movement, the upper hand portion 11 on which the substrate W is placed moves forward.

At this time, based on the detection result obtained by the tilt detection unit 30, the tilt correction unit 40 generates a pitching motion of the hand portion 10 as a whole so as to cancel the tilt of the distal end 11*a* of the upper hand portion 11. That is, the tilt correction unit 40 adjusts the position where the eccentric cam 41*a* supports the lower base 73 to change the tilt angle of the lower base 73.

The eccentric cam motor 42 constantly detects the rotation angle of the eccentric cam 41*a* and is controlled by the control unit 300 based on the obtained detection result. This makes it possible to arbitrarily adjust the rotation angle of the eccentric cam 41*a*. If the tilt detection unit 30 detects a shift of the light-receiving position from the light-receiving reference position, the eccentric cam motor 42 is driven to rotate the eccentric cam 41*a* clockwise.

This pitching motion continues until the tilt of the distal end 11*a* of the upper hand portion 11 is canceled, that is, until the shift amount detection unit 32*a* detects zero shift amount (the light-receiving position C coincides with the light-receiving reference position D). Note that processing of tilting the hand portion 10 is always performed while the moving portion 20 horizontally moves the hand portion 10. This obviates the need to correct tilt correction data such as the weight and the amount of flexure of the transported substrate every time a new substrate is transported even when substrates with different sizes are transported.

Assume that the hand portion 10 vibrates upon movement. Even in this case, because the tilt of the distal end 11*a* or 12*a* of the upper or lower hand portion 11 or 12 is detected, the vibration can be dampened by correcting the tilt of the hand portion 10 until zero shift amount is detected in real time. This makes it possible to reliably transport the substrate to the next process while horizontally holding it even during the vibration.

In this manner, the light-receiving position C and the light-receiving reference position D coincide with each other when the upper hand portion 11 has extended up to a maximum length in a state shown in FIG. 11 by horizontally moving and extending the upper hand portion 11 while correcting the tilt of the upper hand portion 11. In other words, the upper hand portion 11 extends up to a maximum length while the tilt of the distal end 11*a* of the upper hand portion 11 is canceled.

As described above, according to this embodiment, the tilt correction unit 40 tilts the hand portion 10 and moving portion 20 with respect to the horizontal direction so as to cancel the tilt detected by the tilt detection unit 30. This makes it possible to more easily horizontally transport the substrate W placed on the hand portion 10 while correcting flexure of the hand portion 10. Although the fork member 11*c* of the upper hand portion 11 is supported from above by the bundling member 11*d*, and the fork member 12*c* of the lower hand portion 12 is supported from below by the bundling member 12*d* in this embodiment, both of the fork members 11*c* and 12*c* may be supported from below or above.

The tilt detection unit 30 may have the following arrangement as the first modification to the above-described first embodiment. That is, the tilt detection unit 30 includes irradiation units, reflecting units (reflectors), and shift amount detection units. The irradiation units are set at predetermined positions (for example, on the supporting portion 52*b*), and emit light beams toward the distal ends 11*a* and 12*a* of the upper and lower hand portions 11 and 12. The reflecting units are disposed near the distal ends 11*a* and 12*a* of the upper and lower hand portions 11 and 12, and reflect the light beams. The shift amount detection units receive the light beams reflected by the reflecting units, and detect the amounts of shift between the light-receiving positions of the light beams and predetermined light-receiving reference positions.

Figure 15:
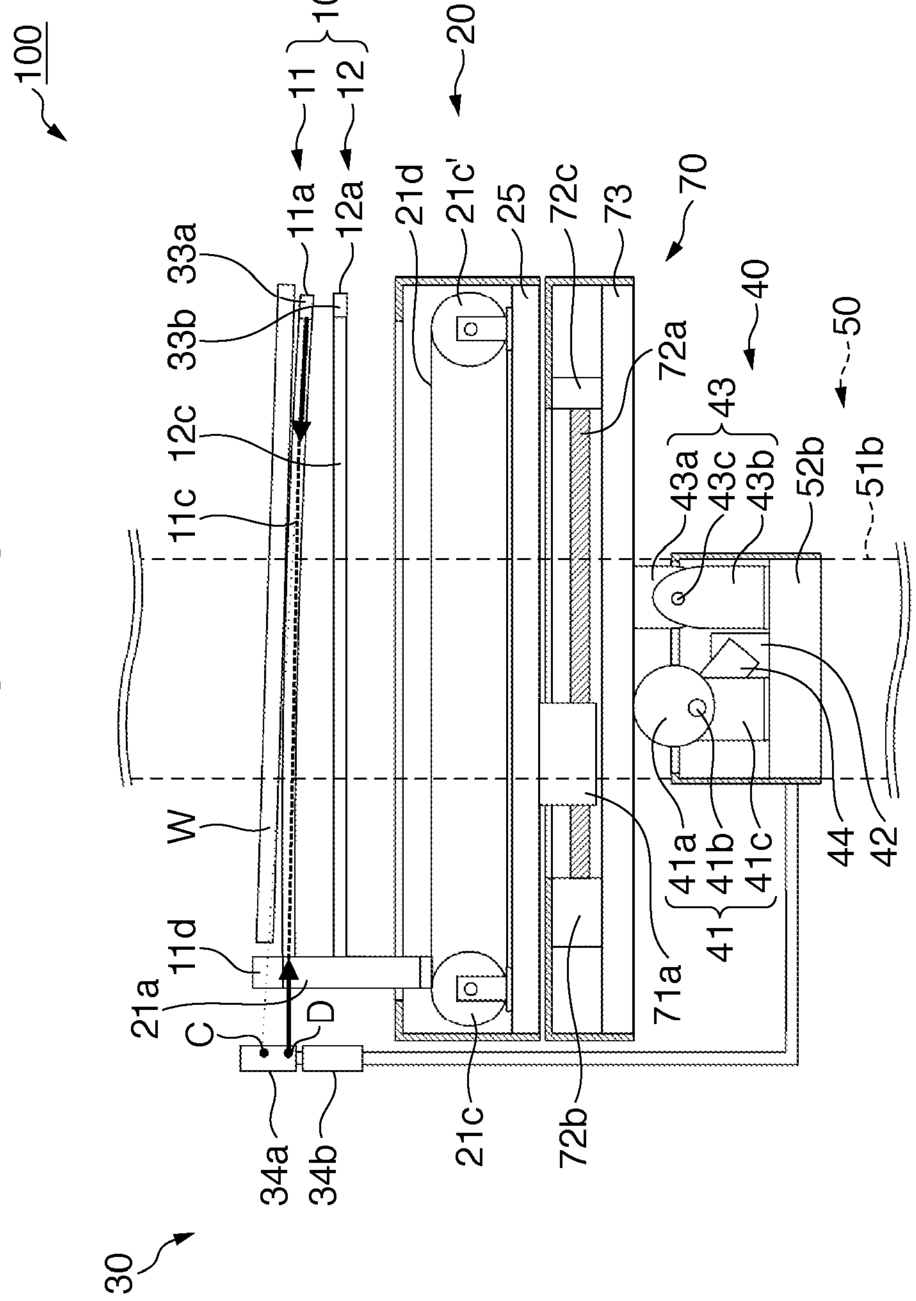
FIG. 15 is an enlarged side view of an apparatus having a tilt detection unit according to another embodiment.

That is, in this modification, reflecting units 33*a* and 33*b* are disposed near the distal ends 11*a* and 12*a* of the upper and lower hand portions 11 and 12 in place of irradiation units, and sensors 34*a* and 34*b* (reflection sensors) each of which serves as both a light projector and a light receiver are set at light-receiving reference positions as shown in FIG. 15. Tilt correction is performed when the light beams reflected by the reflecting units shift from the light-receiving reference positions. As in the above-described first embodiment, if a tilt detection unit (separation type) including irradiation units and shift amount detection units separated from each other is used, the respective units are relatively compact. In contrast, as in the first modification, if reflection sensors are used, a tilt detection unit including them is larger than the separation type. It is therefore necessary to secure a relatively large installation space in the latter case.

If a given installation space cannot be secured, irradiation units and shift amount detection units may be set at different positions using a tilt detection unit of the separation type instead of using sensors each of which serves as both a light projector and a light receiver.

According to this modification, loads imposed on the distal ends 11*a* and 12*a* of the upper and lower hand portions 11 and 12 can be relieved because reflecting units are mounted at the distal ends 11*a* and 12*a* of the upper and lower hand portions 11 and 12 in place of irradiation units. This makes it possible to suppress flexure of the hand portion 10. Moreover, there is no need to connect irradiation units to the distal ends 11*a* and 12*a* of the upper and lower hand portions 11 and 12 through wiring. This makes it possible to simplify the hand portion 10, thus reducing the equipment failure rate.

Second Embodiment

In the above-described first embodiment, the lift mechanism 50 is used to lift/lower the hand portion 10, moving portion 20, tilt detection unit 30, and tilt correction unit 40 to predetermined positions in the height direction. The second embodiment is different from the first embodiment in that in the former a lift mechanism 50 is used not only for this operation but also to adjust a shift of the position in the height direction, which occurs as a result of adjusting the tilt of a hand portion 10 by a tilt correction unit 40. Note that the same reference numerals as in the first embodiment denote the same constituent components in the second embodiment, and a description thereof will not be given.

FIG. 12 is a side view of a substrate transport apparatus 200 according to the second embodiment. In this embodiment, a tilt detection unit 30 includes levelness detectors (tiltmeters) 30*a* and 30*b* which detect the amounts of tilt, with respect to the horizontal direction, of positions (predetermined portions) spaced apart from distal ends 11*a* and 12*a* of upper and lower hand portions 11 and 12. An example of the predetermined portions is the ranges between the intermediate positions in length of fork members 11*c* and 12*c* and the distal ends 11*a* and 12*a*, respectively, in the upper and lower hand portions 11 and 12. This is because in these ranges, the upper and lower hand portions have maximum amounts of flexure and therefore tilt to large degrees. The tilt detection unit 30 is disposed so as not to interfere with a substrate W upon extending to a level higher than the surface on which the substrate W is placed.

The tilt of the hand portion 10 may be corrected until the levelness detectors 30*a* and 30*b* indicate a horizontal state. However, in this case, the substrate W often cannot be transported at a preset level although the distal ends 11*a* and 12*a* of the upper and lower hand portions can be made horizontal. To cope with this, a level measurement unit 60 which measures the levels of the distal ends 11*a* and 12*a* of the upper and lower hand portions 11 and 12 is necessary.

The level measurement unit 60 includes irradiation units 61*a* and 61*b* and shift amount detection units 62*a* and 62*b*. The irradiation units 61*a* and 61*b* are mounted at the distal ends 11*a* and 12*a* of the upper and lower hand portions 11 and 12, and emit light beams parallel to the directions of extensions of the upper and lower hand portions 11 and 12. The shift amount detection units 62*a* and 62*b* receive the light beams, and detect the amounts of shift between the light-receiving positions of the light beams and predetermined light-receiving reference positions. The predetermined light-receiving reference positions are the positions where the shift amount detection units 62*a* and 62*b* receive the light beams while the hand portion 10 and a moving portion 20 are not tilted when flexure does not occur in the hand portion 10.

In this embodiment, the lift mechanism 50 lifts/lowers the upper and lower hand portions 11 and 12, moving portion 20, tilt detection unit 30, and tilt correction unit 40 so as to correct, a fluctuation in level of the distal end 11*a* or 12*a* of the upper or lower hand portion 11 or 12, which accompanies the pitching motion of the upper or lower hand portion 11 or 12, using the tilt correction unit 40 based on the measurement result obtained by the level measurement unit 60. That is, if a shift occurs between a predetermined transport level of the substrate W and its actual transport level upon operating the tilt correction unit 40, the lift mechanism 50 adjusts the shift amount to zero. For example, as shown in FIG. 12, if a detection position F and a light-receiving reference position G are spaced apart from each other by a distance E, the lift mechanism 50 lowers the upper and lower hand portions 11 and 12, moving portion 20, tilt detection unit 30, and tilt correction unit 40 by the distance E.

According to this embodiment, it is possible to adjust the position of the substrate W in the vertical direction by lowering the hand portion 10, moving portion 20, tilt detection unit 30, and tilt correction unit 40 when the level of the substrate W in the vertical direction has changed upon tilting the hand portion 10 and moving portion 20 using the tilt correction unit 40.

In this embodiment, the irradiation units 61*a* and 61*b* of the level measurement unit 60 are mounted at the distal ends 11*a* and 12*a* of the upper and lower hand portions 11 and 12. However, to more precisely detect the actual transport level of the substrate W, the mounting positions of the irradiation units 61*a* and 61*b* may be arbitrarily changed in accordance with the degree of flexure, which changes depending on, for example, the material of the hand portion 10. For example, the irradiation units 61*a* and 61*b* can be set at the intermediate positions between the distal ends 11*a* and 12*a* and proximal sides (rear end sides) 11*b* and 12*b*, respectively, in the upper and lower hand portions 11 and 12.

Other Embodiments

The present invention is also applicable to a control method for the substrate transport apparatus 100 according to the above-described first embodiment. As described above, a substrate transport apparatus 100 includes upper and lower hand portions 11 and 12 and a moving portion 20, and transports a substrate W placed on the upper or lower hand portion 11 or 12 to a processing apparatus or a predetermined storage unit. The substrate W is placed on the upper and lower hand portions 11 and 12. The moving portion 20 supports proximal sides 11*b* and 12*b* each of which serves as one end of a corresponding one of the upper and lower hand portions 11 and 12, and reciprocally moves the upper and lower hand portions 11 and 12 in the directions of their extensions. Although the following description assumes that the moving portion 20 moves the upper hand portion 11, the same operation applies to the lower hand portion 12.

Figure 13:
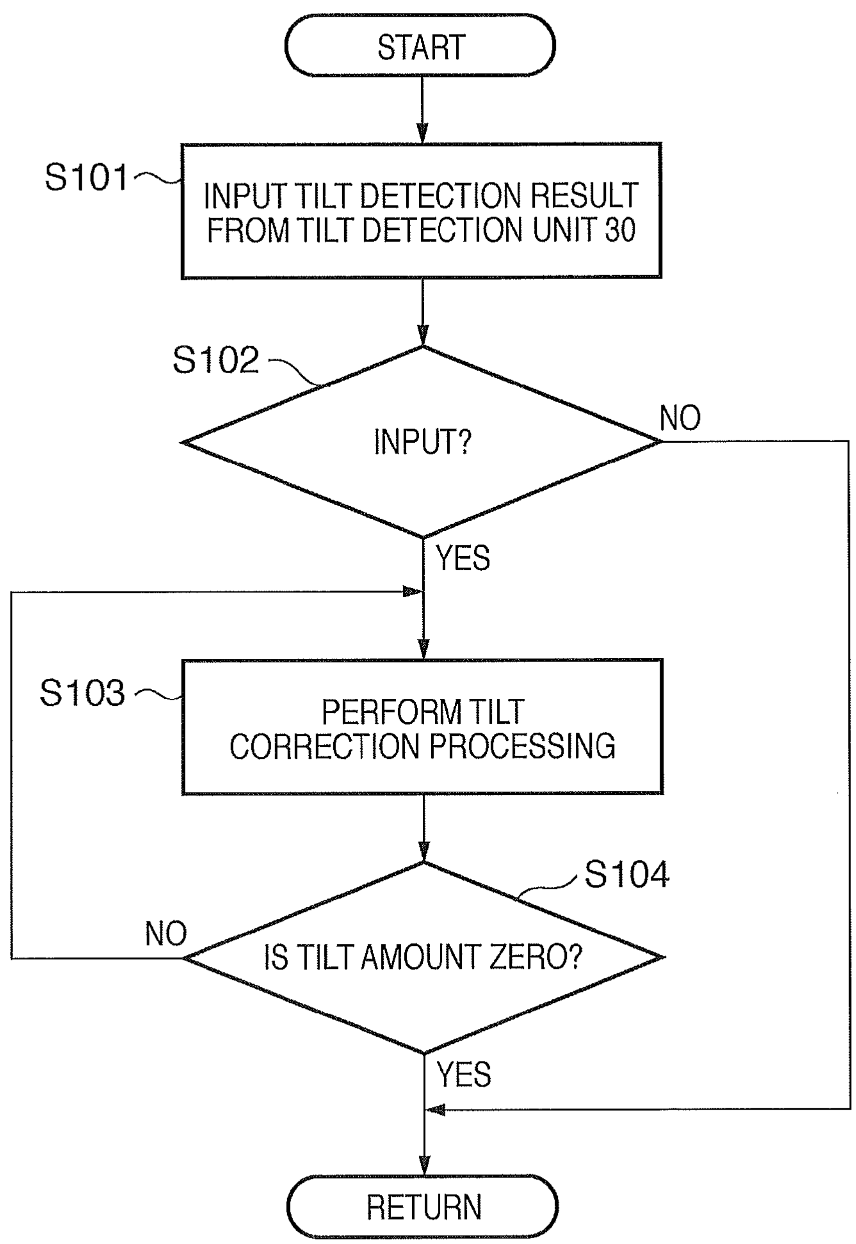
FIG. 13 is a flowchart showing the operation procedure of a control unit 300 of the substrate transport apparatus 100 according to the first embodiment.

FIG. 13 is a flowchart showing the operation procedure of a control unit 300 of the substrate transport apparatus 100. First, in step S101, the detection result of the tilt of a distal end 11*a* or 12*a* of the upper or lower hand portion 11 or 12 with respect to the horizontal direction, which accompanies flexure of the upper or lower hand portion 11 or 12 upon placing the substrate W on it, is input to the control unit 300.

In step S102, it is determined whether the detection result obtained by the tilt detection unit 30 has been input to the control unit 300. If it is determined in step S102 that no detection result has been input, a series of processes ends. On the other hand, if it is determined in step S102 that the detection result has been input, in step S103 a pitching motion of the hand portion 10 as a whole is generated so as to cancel the distal end 11*a* or 12*a* of the upper or lower hand portion 11 or 12 based on the detection result obtained by the tilt detection unit 30.

In step S104, it is determined whether the tilt detection unit 30 has detected zero tilt amount. If it is determined in step S104 that zero tilt amount has not been detected, the process returns to step S103, in which the processing of tilting the moving portion 20 continues. On the other hand, if it is determined in step S104 that zero tilt amount has been detected, a series of processes ends. Note that in a series of processes in steps S101 to S104, tilt correction processing is performed while the moving portion 20 moves the hand portion 10 in the direction of its extension.

The present invention is also applicable to a control method for the substrate transport apparatus 200 according to the second embodiment. As described above, a substrate transport apparatus 200 includes a lift mechanism 50 which lifts/lowers a hand portion 10 and moving portion 20.

Figure 14:
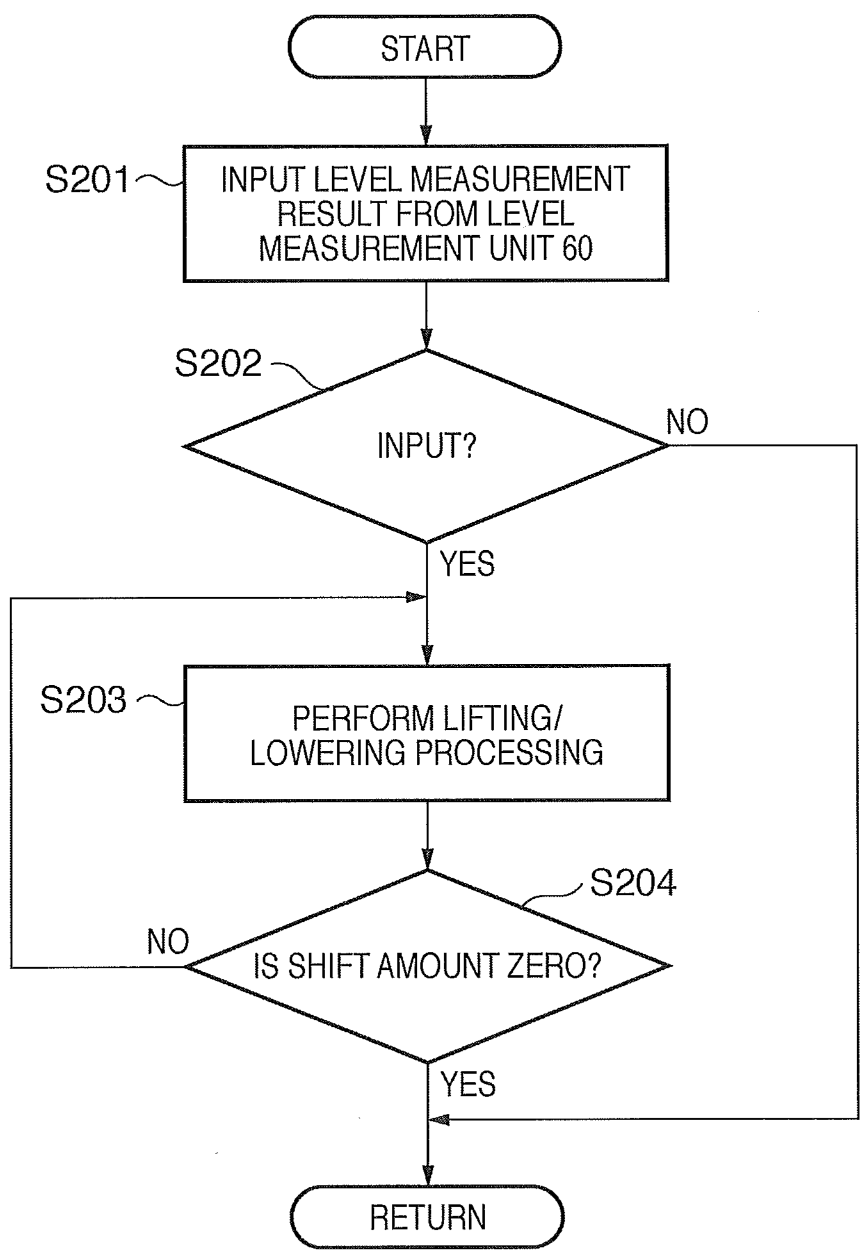
FIG. 14 is a flowchart showing the operation procedure of a control unit 300 of the substrate transport apparatus 200 according to the second embodiment.

FIG. 14 is a flowchart showing the operation procedure of a control unit 300 of the substrate transport apparatus 200 according to the second embodiment. First, in step S201, the measurement result of the level of a distal end 11*a* or 12*a* of an upper or lower hand portion 11 or 12 using a level measurement unit 60 after a pitching motion of the hand portion 10 is generated by a tilt correction process is input to the control unit 300.

In step S202, it is determined whether the detection result obtained by the level measurement unit 60 has been input to the control unit 300. If it is determined in step S202 that no detection result has been input, a series of processes ends. On the other hand, if it is determined in step S202 that the detection result has been input, in step S203 the hand portion 10 and moving portion 20 are lifted/lowered using the lift mechanism 50 so as to correct a fluctuation in level (the amount of shift from a reference position) of the distal end 11*a* or 12*a* of the upper or lower hand portion 11 or 12, which accompanies the pitching motion of the hand portion 10 by a tilt correction process, based on the measurement result obtained by the level measurement unit 60.

In step S204, it is determined whether a tilt detection unit 30 has detected zero tilt amount. If it is determined in step S204 that zero tilt amount has not been detected, the process returns to step S203, in which the processing of tilting the hand portion 10 and moving portion 20 continues. On the other hand, if it is determined in step S204 that zero tilt amount has been detected, a series of processes ends.

The invention claimed is:

1. A substrate transport apparatus which transports a substrate placed on a hand portion to one of a processing apparatus and a predetermined storage unit, comprising:

moving means for supporting a proximal side of the hand portion serving as one end of the hand portion, and reciprocally moving the hand portion in a direction of an extension thereof;

tilt detection means for detecting a tilt of a distal end of the hand portion with respect to a horizontal direction in real time during a horizontal movement of the hand portion, which accompanies flexure of the hand portion upon reciprocally moving the hand portion;

tilt correction means for generating a pitching motion of the hand portion as a whole in the direction in which the tilt of the distal end of the hand portion is canceled; and controlling means for controlling the pitching motion of said tilt correction means to move the hand portion in the condition in which the tilt of the hand portion is canceled, wherein said tilt detection means comprises irradiation means for emitting a light beam toward the distal end of the hand portion, reflecting means, disposed near the distal end of the hand portion, for reflecting the light beam, and shift amount detection means for receiving the light beam reflected by said reflecting means, and detecting an amount of shift of a light-receiving position of the light beam and a predetermined light-receiving reference position.

2. The substrate transport apparatus according to claim 1, further comprising a lift mechanism which lifts/lowers the hand portion, said moving means, said tilt detection means, and said tilt correction means.

3. The substrate transport apparatus according to claim 1, further comprising second moving means for reciprocally moving said moving means as a whole in the direction of an extension of the hand portion.

4. A substrate transport apparatus which transports a substrate placed on a hand portion to one of a processing apparatus and a predetermined storage unit, comprising:

moving means for supporting a proximal side of the hand portion serving as one end of the hand portion, and reciprocally moving the hand portion in a direction of an extension thereof;

tilt detection means for detecting a tilt of a distal end of the hand portion with respect to a horizontal direction in real time during a horizontal movement of the hand portion, which accompanies flexure of the hand portion upon reciprocally moving the hand portion;

tilt correction means for generating a pitching motion of the hand portion as a whole in the direction in which the tilt of the distal end of the hand portion is canceled; and controlling means for controlling the pitching motion of said tilt correction means to move the hand portion in the condition in which the tilt of the hand portion is canceled, wherein said tilt detection means is a tiltmeter, which is located between the distal end of the hand portion and an intermediate position of the hand portion, for detecting the amounts of tilt on the located position.

5. The substrate transport apparatus according to claim 4, further comprising a lift mechanism which lifts/lowers the hand portion, said moving means, said tilt detection means, and said tilt correction means.

6. The substrate transport apparatus according to claim 4, further comprising second moving means for reciprocally moving said moving means as a whole in the direction of an extension of the hand portion.

7. The substrate transport apparatus according to claim 4, further comprising a lift mechanism which lifts/lowers said hand portion, said moving means, said tilt detection means, and said tilt correction means, and level measurement means for measuring a level of the distal end of the hand portion, wherein said hand portion, said moving means, said tilt detection means, and said tilt correction means are lifted/lowered so as to correct a fluctuation in level of the distal end of the hand portion, which accompanies the pitching motion of the hand portion by said tilt correction means, based on the measurement result obtained by said level measurement means.

8. The substrate transport apparatus according to claim 7, wherein said level measurement means comprises irradiation means, disposed near the distal end of the hand portion, for emitting a light beam parallel to a direction of an extension of the distal end of the hand portion, and shift amount detection means for receiving the light beam and detecting an amount of shift between a light-receiving position of the light beam and a predetermined light-receiving reference position.

9. A control method for a substrate transport apparatus which comprises a hand portion on which a substrate is placed, and moving means for supporting a proximal side of the hand portion serving as one end of the hand portion, and reciprocally moving the hand portion in a direction of an extension thereof, and which transports the substrate to one of a processing apparatus and a predetermined storage unit, comprising:

a tilt detection step of detecting a tilt of a distal end of the hand portion with respect to a horizontal direction in real time during a horizontal movement of the hand portion, which accompanies flexure of the hand portion occurring when the moving means reciprocally moves the hand portion;

a tilt correction step of generating a pitching motion of the hand portion as a whole in the direction in which the tilt of the distal end of the hand portion is canceled; and a controlling step of controlling the pitching motion so as to generate the pitching motion in the direction canceling the tilt of the hand portion, and move/extend the hand portion to a horizontal direction, wherein the substrate transport apparatus comprises a lift mechanism which lifts/lowers the hand portion and the moving means, and the control method further comprises a level measurement step of measuring a level of the distal end of the hand portion after a pitching motion of the hand portion is generated in the tilt correction step, and lifting/lowering the hand portion and the moving means using the lift mechanism so as to correct a fluctuation in level of the distal end of the hand portion, which accompanies the pitching motion of the hand portion in the tilt correction step, based on the detection result obtained in the level measurement step.

* * * * *